United States Patent
Scovell

(10) Patent No.: US 6,558,477 B1
(45) Date of Patent: May 6, 2003

(54) REMOVAL OF PHOTORESIST THROUGH THE USE OF HOT DEIONIZED WATER BATH, WATER VAPOR AND OZONE GAS

(75) Inventor: Tim Scovell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 09/688,757

(22) Filed: Oct. 16, 2000

(51) Int. Cl.[7] .................................................. B08B 3/00
(52) U.S. Cl. ..................... 134/30; 134/25.4; 134/32; 134/33; 134/37; 134/902
(58) Field of Search ............................ 134/2, 3, 26, 30, 134/32, 33, 37, 25.4, 902

(56) References Cited

U.S. PATENT DOCUMENTS

| | | | |
|---|---|---|---|
| 4,341,592 A | 7/1982 | Shortes et al. | 156/643 |
| 4,885,047 A | 12/1989 | Ury et al. | 156/345 |
| 5,000,208 A | 3/1991 | Ludwig et al. | 134/58 R |
| 5,378,317 A | 1/1995 | Kashiwase et al. | 156/659.1 |
| 5,417,826 A | 5/1995 | Blalock | 204/176 |
| 5,464,480 A * | 11/1995 | Matthews | 134/1.3 |
| 5,709,754 A | 1/1998 | Morinville et al. | 134/1.3 |
| 5,749,975 A | 5/1998 | Li et al. | 134/1.3 |
| 5,895,272 A | 4/1999 | Li | 438/705 |
| 5,913,981 A | 6/1999 | Florez | |
| 6,017,827 A | 1/2000 | Morgan et al. | 438/745 |
| 6,080,531 A | 6/2000 | Carter et al. | 430/329 |
| 6,240,933 B1 * | 6/2001 | Bergman | 134/1.3 |
| 6,269,511 B1 | 8/2001 | Andreas et al. | |
| 6,273,100 B1 | 8/2001 | Andreas et al. | |
| 6,299,696 B2 * | 10/2001 | Kamikawa et al. | 134/2 |

FOREIGN PATENT DOCUMENTS

EP 0 548 596 * 6/1993

OTHER PUBLICATIONS

U.S. patent application Ser. No. 09/468,022, Andreas, filed Dec, 20, 1999, allowed.

* cited by examiner

Primary Examiner—Zeinab El-Arini
(74) Attorney, Agent, or Firm—Whyte Hirschboeck Dudek SC

(57) ABSTRACT

A method for removing photoresist or other organic material from a substrate such as a semiconductor wafer is provided. The method includes partially immersing the substrate in a solvent (e.g., deionized water) in a reaction chamber, injecting an oxidizing gas (e.g., ozone) into the reaction chamber, and rotating or otherwise moving the substrate through the solvent to coat a thin film of solvent over the organic component on the substrate surface and expose the solvent-coated substrate to the ozone gas to remove the organic material from the surface.

47 Claims, 4 Drawing Sheets

REMOVAL OF PHOTORESIST THROUGH THE USE OF HOT DEIONIZED WATER BATH, WATER VAPOR AND OZONE GAS

FIELD OF THE INVENTION

The present invention relates generally to the fabrication of semiconductor devices. More particular, the invention relates to a method and system of removing photoresist or other organic materials from a substrate in a semiconductor manufacture.

BACKGROUND OF THE INVENTION

Photolithography processes are used in semiconductor manufacture to remove portions of the top layers on a wafer surface and create a desired pattern. Generally, this involves utilizing a polymeric resist that reacts to ultraviolet light, as for example, a novolak/diazonaphtoquinone or novolak/quinonediazide resist.

Typically, this technique involves coating the wafer with a layer of a light-sensitive polymeric photoresist material, transferring the desired pattern formed in a reticle into the photoresist layer, and exposing the photoresist to light (e.g., UV light) to image the pattern on the reticle onto the photoresist layer. This changes the character of the exposed or unmasked portions of the pattern, and the resist layer then undergoes development, for example, using chemical solvents, to selectively remove the unmasked portions of the resist to provide a desired pattern having open areas in the resist layer. Etchants are then applied to remove an underlying substrate, such as silicon, metal or an insulator, that is exposed through the mask openings. Photoresist masks are used in processing steps such as etching, ion implantation, reworks, and high temperature postbakes. After etching is completed the photoresist layer is no longer needed and must be removed prior to subsequent processing of the wafer. The main object of a photoresist removal is to quickly and completely strip the photoresist without effecting the underlying substrate surface.

There are many conventional resist removal processes that are known to those skilled in the art, including, for example, wet chemical processing and dry plasma etching processing. A typical wet chemical etch involves immersing the wafer in an inorganic resist stripper. A common mixture is a solution of sulfuric acid ($H_2SO_4$) and an oxidant such as hydrogen peroxide ($H_2O_2$), which attacks organic materials and converts the carbon in the resist to $CO_2$ gas. However, wet cleaning has several drawbacks, including particle generation, difficulties with drying, high expense, and chemical waste disposal. In addition, wet cleaning may require mechanical scrubbing to remove all remnants of the resist.

An alternative to wet cleaning to remove resist and other organic films from a wafer is the use of ozone ($O_3$) as the primary chemical agent. One technique involves exposing the photoresist to an $O_3$-containing gaseous atmosphere while heating the substrate on which the photoresist layer is disposed. The ozone oxidizes the resist and other organics into by-products such as water, carbon monoxide (CO) and carbon dioxide ($CO_2$). Ozone is highly selective to organic materials, and does not etch silicon, silicon dioxide, or aluminum. However, in a gas phase process, ozone must react with the organic material until it volatilizes into a gas phase.

Methods have also been described that utilize ozonated deionized (DI) water to remove resist and resist residues. In one known method, the wafers are immersed in a chilled water bath (about 5° C.) and ozone is diffused into the water to strip the resist. A drawback of this method is the low strip rate for the resist.

Another process involves heating the wafers and steam-treating with an ozonated water mixture. A process has also been described in which wafers mounted in a carrier are sprayed with ozonated water within a process chamber. In either process, the resist is stripped as the water runs down the wafer surface. However, such methods do not adequately strip the resist and resist residues from the wafer surface. Additionally, residual resist can remain on the wafer at the contact points between the wafer and the carrier. In the use of spray systems, specific control elements and a more complex system than desirable is needed, and the spray mechanisms may not provide a suitable misting of the wafer surface resulting in poor uniformity of removal.

In another process, the wafers are spun at high revolutions per minute (RPM) and simultaneously sprayed with warm water while ozone is pumped into the reaction chamber. However, it is difficult to maintain a suitably thin layer of water on the surface of the wafer for effective permeation of the ozone to the surface of the wafer.

In view of the foregoing, there is a need for a method of removing photoresist or other organic materials from a substrate that overcomes these problems.

SUMMARY OF THE INVENTION

The present invention overcomes the disadvantages of known methods in providing an improved method and system for removing photoresist and, more generally, organic components, from the surface of a substrate such as a semiconductor wafer. The method can be used in conjunction with other compatible methods used for organic material removal.

According to the method of the invention, at least a portion of a water or other substrate having an organic component on the surface, is submerged in a solvent, preferably deionized water, and the substrate is then moved relative to the solvent such that a thin layer of solvent is deposited over the organic component on the surface of the substrate, which is then exposed to ozone gas for removal of the organic component.

In one embodiment of the method, the substrate such as a semiconductor wafer is rotated through a solvent section and a gaseous section of the reaction chamber of a cleaning module. Rotation of the wafer through the solvent is controlled so that a thin film or layer of solvent is formed over the organic component on the surface of the substrate which is then exposed to ozone gas in the gaseous section of the reaction chamber. The thickness of the solvent layer is sufficiently thin to facilitate diffusion of the ozone gas therethrough to react with the organic material and remove at least a portion of the organic material from the substrate surface.

As the wafer or other substrate is rotated and passes through the solvent and into the gaseous section, a meniscus of solvent forms at the interface between the solvent and the surface of the wafer, while a thin layer of the solvent is formed over the organic component on the surface of the substrate. Preferably, the ozone gas reacts with the organic component on the surface of the substrate through the meniscus as well as the solvent layer. In addition, water vapor may condense onto the organic component on the surface of the wafer, and the ozone gas can also react with the organic component through the water vapor layer. Gaseous by-products such as CO and $CO_2$ that are formed by the reaction are exhausted from the reaction chamber.

In another embodiment of the method, the substrate can be vertically moved into and out of the solvent section and the gaseous section. Such vertical movement is controlled similarly to the above described rotational movement to form a suitably thin layer of solvent over the organic component on the surface of the substrate as it is drawn upward out of the solvent into the gaseous section whereupon exposure to the ozone gas effectively removes the organic component from the surface of the substrate.

In the use of the method in a semiconductor process, a plurality of semiconductor wafers or other substrates can be loaded into a carrier and moved into a cleaning module that includes a reaction chamber having a gaseous section for containing ozone gas and a section containing a solvent, preferably deionized water, to provide a solvent bath. The solvent section can comprise structure such as a container for holding the solvent therein. The solvent section is adapted to receive the wafer carrier such that the semiconductor wafers are at least partially submerged in the solvent. The solvent section can include a mechanism for contacting the wafer carrier and the semiconductor wafers, and moving the wafers relative to the solvent section and the gaseous section, for example, by vertical or rotational movement. Preferably, the mechanism is operable to rotate the wafers through the solvent and gaseous sections of the reaction chamber. The carrier is loaded into the reaction chamber of the cleaning module and positioned in the solvent such that the wafers are at least partially submerged within the solvent, and the rotating or moving mechanism is placed in contact with the semiconductor wafers. Ozone gas is flowed into the reaction chamber and the moving mechanism is activated to move the wafers through the solvent to form a thin layer of solvent over the organic component on the surface of the wafers and then into the gaseous section to expose the solvent layer to the ozone gas. As the solvent-covered substrate passes through the gaseous section, the ozone gas diffuses through the solvent layer to react with and remove at least a portion of the organic component from the substrate surface.

Also provided is a system embodying a cleaning apparatus for use in the method of the invention. The system includes a reaction chamber comprising a gaseous section for containing ozone gas and a solvent section than can include structure such as a container for holding the solvent. The solvent section is adapted to receive at least one wafer at least partially submerged within the solvent. The system also includes a mechanism to contact and move the substrate relative to the solvent section and the gaseous section, for example by vertical movement and/or preferably by rotational movement. The system further includes a source of ozone gas such as an ozone generator that is in flow communication with the gaseous section of the reaction chamber. The system can further include a conveyor mechanism that moves the wafers or other substrate through the reaction chamber and the solvent, an exhaust pump for removing gaseous by-products from the reaction chamber, and an element for heating the solvent.

Advantageously, the present invention provides an improved method and system for removing substantially all traces of photoresist or other organic components from the surface of a substrate. In addition, the invention provides a method and system for removing organic material that is efficient, low cost, and adaptable to volume semiconductor manufacture. The invention eliminates mechanisms such as spray nozzles and conventional cycling mechanisms, requires fewer control devices than conventional systems, and provides a uniform rate of resist removal.

BRIEF DESCRIPTION OF THE DRAWINGS

Preferred embodiments of the invention are described below with reference to the following accompanying drawings which are for illustrative purposes only. Throughout the following views, reference numerals will be used on the drawings, and the same reference numerals will be used throughout the several views and in the description to indicate same or like parts.

DETAILED DESCRIPTION

In a semiconductor device fabrication process, a polymeric resist is applied on a substrate to form a resist layer that typically has a thickness of about 0.5 microns to about 1.5 microns. After an etch process, the resist layer is then removed. The present invention provides a method and system for removing photoresist or other organic components from a substrate such as a wafer used in the fabrication of semiconductor devices.

Figure 1:
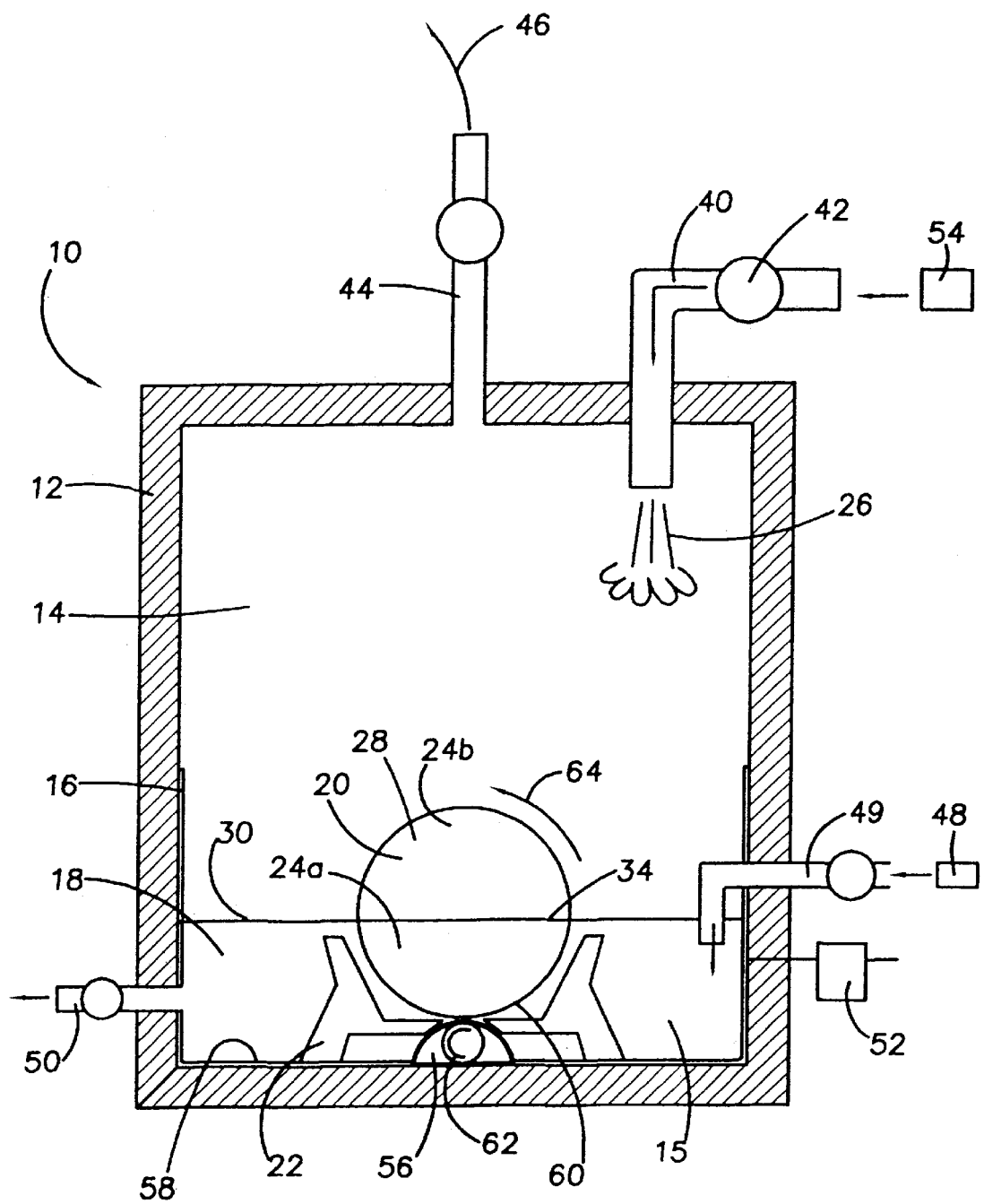
FIG. 1 is a schematic diagram of an embodiment of a system for removing photoresist according to the invention.
Figure 2:
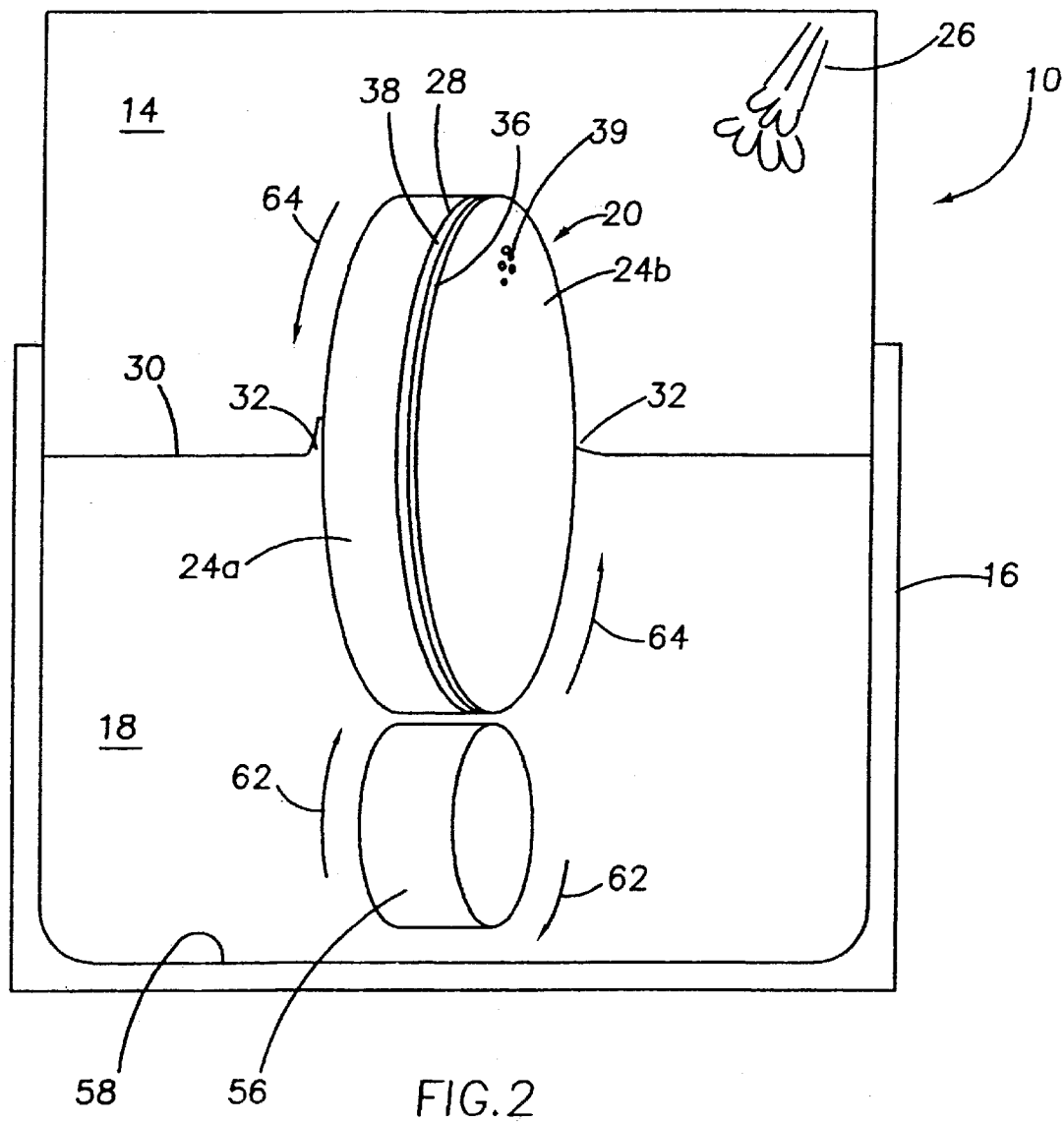
FIG. 2 is a diagrammatic perspective view depicting a semiconductor wafer (with the carrier not shown) and rotor mechanism of the system of FIG. 1.
Figure 3:
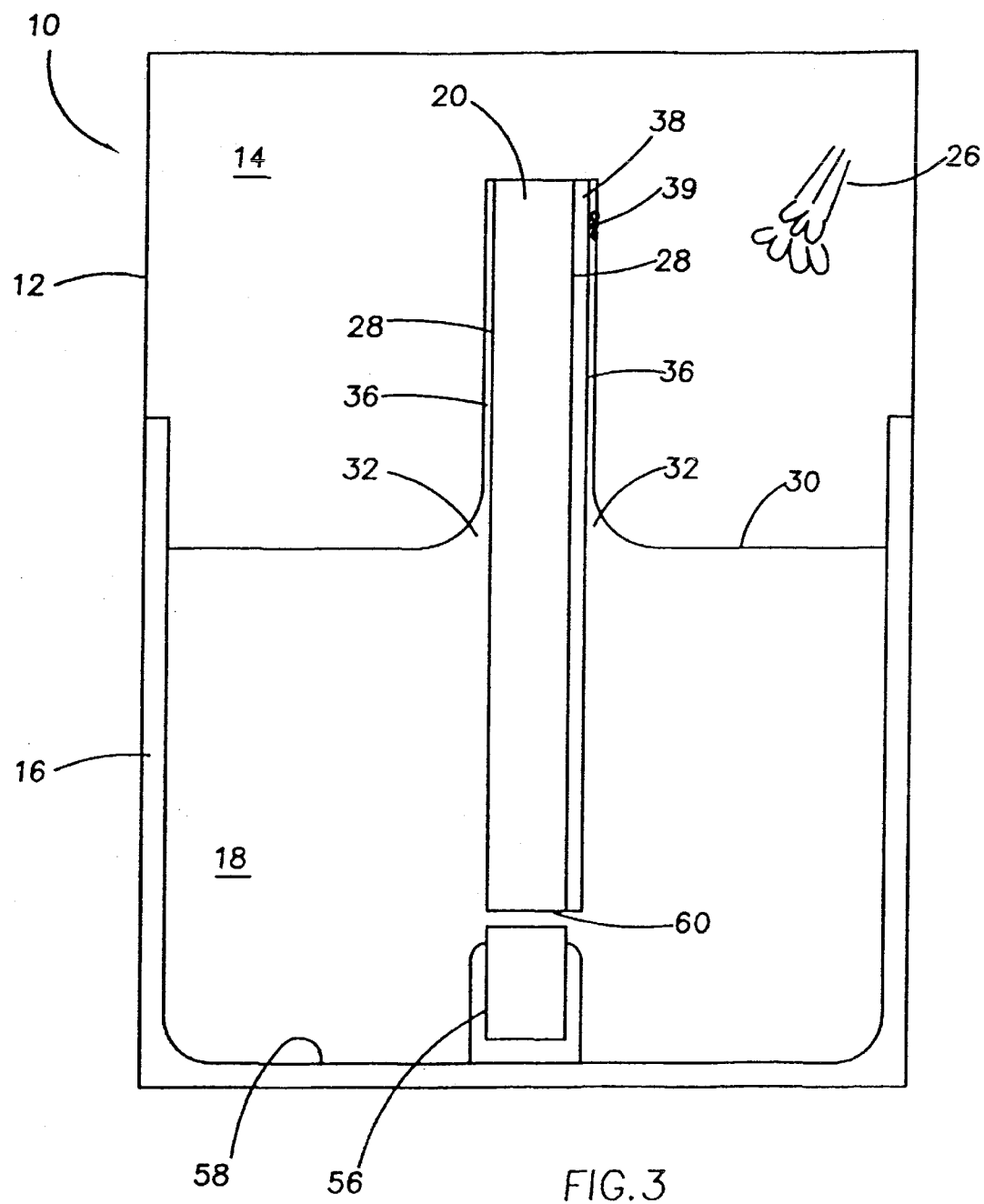
FIG. 3 is a diagrammatic cross-sectional view of a semiconductor wafer (carrier not shown) with a layer of photoresist being removed using the system shown in FIG. 1.

The method and system of the invention will be described generally with reference to the drawings for the purpose of illustrating the present preferred embodiments of the invention only and not for purposes of limiting the same. FIGS. 1–3 illustrate processing steps for use in the fabrication of semiconductor devices in accordance with the present invention. It should be readily apparent that the processing steps are only a portion of the entire fabrication process. The present invention particularly deals with the method of removing photoresist and other carbon-based materials that are used in the fabrication of semiconductor devices.

A first embodiment of a method of the present invention for cleaning photoresist or other organic component from the surface of a substrate in the form of a semiconductor wafer is described with reference to FIGS. 1–3. According to the method, a reaction chamber 12 is provided that includes a gaseous section 14 and a solvent section 15 comprising a container 16 to contain a solvent 18, preferably deionized water. The wafers 20 are moved into the reaction chamber 12, typically by means of a carrier or boat 22 that holds the wafers 20 in a vertical orientation. The wafers 20 are placed in the solvent 18 such that about half 24a of the wafer is immersed in the solvent and about half 24b extends into the gaseous section 14 of the chamber 12. Ozone gas 26 is then supplied to the gaseous section 14 of the chamber 12, and the wafers 20 are continuously rotated such that the wafers 20 pass through the solvent 18 and then the gaseous section 14 of the chamber 12 to expose the solvent-coated surface 28 of the wafer to the ozone gas 26.

Referring to FIGS. 2 and 3, as the wafer 20 is rotated or otherwise moved through the surface 30 of the solvent 18 into the gaseous section 14, a meniscus 32 of water or other solvent forms at the interface 34 between the wafer and the solvent, and a thin film 36 of solvent forms over the organic component 38 on the surface 28 of the wafer. The rotation of the wafer is at a speed effective to cause a thin layer 36 of the solvent to form that will effectively wet the surface and remain as a film or coating over a majority of the organic component 38 while the wafer is moved through the gaseous section 14. In addition, water vapor 39 from the solvent bath can condense on a portion of the wafer to wet the surface and the organic component 38. The solvent layer 36 and water vapor layer 39 are sufficiently thin to allow the ozone ($O_3$) gas to diffuse through the solvent layer 36 to the underlying photoresist or other organic component 38. Preferably, a solvent layer 36 having a thickness of about 0.001 to about 100 microns, more preferably about 0.001 to about 50 microns is formed over the organic component 38. Water vapor layer 39 is preferably about 0.001 to about 100 microns thick, preferably about 0.001 to about 50 microns. It is also preferred that the speed of rotation of the wafer 20 is about 1 to about 10 mm/second. Ozone ($O_3$) can also be dissolved or mixed into (e.g., bubbled into) the solvent (e.g., deionized water) to increase the resist strip rate and increase the effectiveness of the method.

As the wetted surface of the wafer 20 is passed into and through the gas-phase section 14 of the reaction chamber 12, the ozone gas 26 permeates through the thin layer 36 of solvent and water vapor 39, and preferably through the meniscus 32, to react with and dissolve the resist or other carbon-based (organic) component 38 on the surface 28 of the wafer. The ozone ($O_3$) decomposes into diatomic oxygen and atomic oxygen (O), and the photoresist or other organic component 38 is oxidized into CO and $CO_2$ reaction products, which are exhausted from the system. Any solid by-products are rinsed from the surface of the wafer 20 as the wafer is moved from the gaseous section 14 and through the solvent section 18.

The ozone gas 26 is flowed into the reaction chamber 12 to provide a concentration effective to diffuse through the solvent layer 36 and water vapor layer 39 and react with the resist or other organic component 38 to remove at least a portion of the organic component 38 from the wafer surface 28 as the wafer 20 passes through the gaseous section 14 of the chamber 12. The flow of ozone 26 into the reaction chamber 12 can range from about 2000 to about 9000 sccm, preferably about 3000 to about 7000 sccm, to provide a concentration of ozone gas in the reaction chamber of about 80 to about 300 grams per $m^3$, preferably about 150 to about 250 grams per $m^3$.

Preferably, a pressure of about 1 mTorr to about 10 Torr is maintained in the reaction chamber 12 during the removal process. The temperature of the solvent 18 is preferably maintained at about 80° C. to about 95° C., more preferably about 85° C. to about 90° C. The gaseous section 14 of the reaction chamber 12 can be maintained at about ambient temperature.

The process is performed for a predetermined period of time necessary to remove the photoresist or other organic component 38 from the surface 28 of the wafer. The time period is determined, at least in part, by the thickness of the organic component to be removed, the concentration of ozone in the reaction chamber, and the nature of the solvent that is used. A treatment period of up to about 10 minutes is generally effective to remove resists up to about 3 microns thick at a strip rate of about 1,500 angstroms per minute. Longer time periods can be utilized as necessary to remove resist layers that are greater than 3 microns.

Referring to FIG. 1, an embodiment of a system 10 for use in removing organic materials from a wafer according to the invention is illustrated. As shown, the system 10 includes a reaction chamber 12 containing a gaseous section 14 and a solvent section 15 which includes structure such as a tank or other container 16 containing the solvent 18, preferably deionized water. A gas supply unit 54, for example, an ozone generator, can be used to supply a gaseous atmosphere containing ozone 26 ("ozone gas") into the gaseous section 14 of the reaction chamber 12 through an inlet 40 at a predetermined rate. A flow control mechanism 42, such as a valve, can be included to regulate the flow of gas 26 into the reaction chamber. In general, the ozone generator converts oxygen to ozone. Such devices are commercially available and well known in the art.

The reaction chamber 12 is a sealed chamber designed to contain the ozone gas 26 at about room temperature or greater, and a pressure of about 1 mTorr to about 10 Torr (atmospheric pressure). The reaction chamber 12 includes an outlet or vent 44 for exhausting reactive by-products 46. The container 16 receives the solvent 18 (e.g., deionized water) from a source 48 through a conduit 49. The solvent 18 can be drained from the container 16 through a conduit 50. The temperature of the solvent can be maintained using a temperature control device 52.

Wafers 20 to be cleaned are moved through the reaction chamber 12 and into and out of the solvent 18 by conventional means that are readily available and known in the art (not shown). The wafers 20, positioned vertically in a carrier 22, are loaded into the container 16 (i.e., water bath) such that a portion 24a of the wafer is immersed in the solvent 18, and a portion 24b is positioned in the gaseous section 14 of the reaction chamber for exposure to the ozone gas 26. The reaction chamber 12 is sealed and purged, for example, with an inert gas such as argon or helium. The flow of ozone gas 26 from the gas supply unit 54 is initiated, and the wafers 20 are moved by rotational movement in accordance with the invention to solubilize the resist or other organic material 38. The ozone gas 26 is flowed into the reaction chamber 12 in an amount sufficient to diffuse through the layer or film 36 of solvent and condensed water vapor layer 39 that forms on the wafer 20 in the practice of the invention, and to react with and remove the photoresist or other organic component 38 disposed on the surface 28 of the wafer 20. As the wafers 20 are rotated through the solvent 18 and then exposed to the ozone gas 26, the organic component 38 is oxidized into CO and $CO_2$ reaction products, which are exhausted from the system 10 through the vent 44. When the process is completed, the wafers 20 are removed from the solvent 18 and conveyed onto the next processing step.

The wafers 20 are typically transported inside a conventional flat wafer carrier or boat 22 that is adapted to support the wafers 20 in slots (not shown) in a vertical position. The carrier 22 is typically loaded with about fifty wafers, which are similarly processed simultaneously according to the present method. Preferably, the wafers 20 are mounted in a carrier 22 that facilitates rotation of the wafers to expose the entire surface 28 of the wafer to both the solvent 18 and the ozone gas 26. A useful wafer carrier for the present invention is described, for example, in U.S. Pat. No. 5,000,208 (Ludwig et al.), using a standard Fluorware low mass carrier, the disclosure of which is incorporated by reference herein. Briefly, the wafers are set vertically into slots and retained in the carrier by a pair of support rods that bear against and support the top edges of the wafers (not shown).

In a preferred embodiment of the system 10, a motor-driven roller mechanism 56 is positioned on the bottom 58 of the container 16 to contact and rotate the wafers 20 through the solvent 18. As shown in FIG. 1, the carrier 22 is placed into the container 16 to straddle the roller mechanism 56. As the bottom edges 60 of the wafers 36 are brought into contact with the roller mechanism 56, the wafers are raised upward about 1/16th inch to move the wafers out of direct contact with the carrier 22. As the roller 56 is turned in the direction of arrow 62, the wafers 20 are rotated in the direction of arrow 64.

Figure 4:
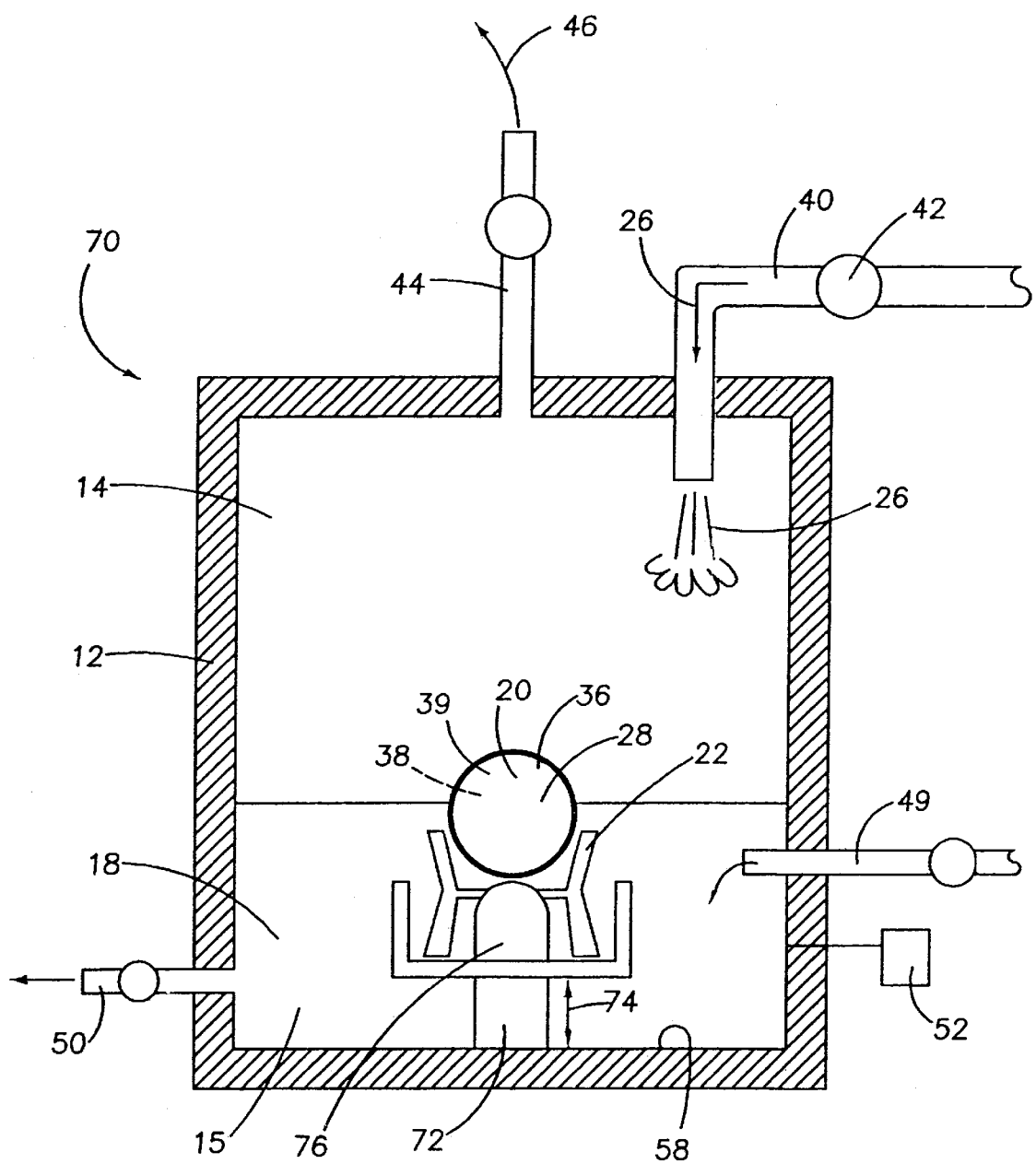
FIG. 4 is a schematic diagram of another embodiment of a system for removing photoresist according to the invention.

Referring to FIG. 4, in another embodiment of the method of the invention and a system 70 for utilizing that method, the wafers 20 can be moved into and out of the solvent section 15 by vertical movement. A thin film or layer 15 of solvent is formed over the organic components 38 on the surface 28 of the wafer 20 as the wafer is drawn upward out of the solvent 18, and is exposed to the ozone gas 26 in the gaseous section 14 of the reaction chamber 12. To facilitate such vertical movement, a wafer carrier 22 can be mounted on a device 72 operable to move the carrier 22 vertically through the solvent 18 and into the gaseous section 14, and back down into the solvent, as depicted by arrow 74. Preferably, the device 72 includes a member 76 that is structured to contact and raise the wafers out of direct contact with the carrier 22, for example, about 1/16th inch, when the carrier is placed onto the mechanism 72. This ensures coverage of the solvent 18 and exposure to the ozone gas 26 over the entire surface of the wafer 20 for complete removal of the photoresist or other organic material 30 from the surface 28 of the wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for cleaning a surface of a substrate having an organic material disposed thereon, comprising the steps of:
   submerging at least a portion of the substrate in a solvent;
   moving the substrate through the solvent to form a thin layer of solvent over the organic material on the surface of the substrate;
   exposing the solvent layer to an ozone gas atmosphere, whereby the ozone gas diffuses through the solvent layer to remove at least a portion of the organic material from the substrate surface; and
   moving the substrate through the solvent to rinse off solid reaction by-products from the surface of the substrate.

2. The method of claim 1, wherein the step of moving the substrate through to the solvent includes rotational movement of the substrate.

3. The method of claim 1, wherein the step of moving the substrate through to the solvent includes vertical movement of the substrate.

4. The method of claim 1, wherein the solvent consists essentially of deionized water.

5. The method of claim 1, wherein the solvent comprises deionized water and ozone.

6. The method of claim 1, further comprising mixing ozone into the solvent.

7. A method for removing organic material from a surface of a substrate, comprising the steps of:
   providing a reaction chamber having a gaseous section for containing a gas, and a solvent section containing a solvent;
   moving the substrate through the solvent to form a thin layer of the solvent over the organic material on the surface of the substrate; and
   moving the substrate having the solvent layer disposed thereon through an ozone gas atmosphere within the gaseous section to remove at least a portion of the organic material from the substrate surface.

8. The method of claim 7, wherein the solvent comprises deionized water.

9. The method of claim 7, wherein the solvent comprises deionized water and ozone.

10. The method of claim 7, wherein the solvent has a temperature of about 80° C. to about 95° C.

11. A method for removing organic material from a surface of a substrate, comprising the steps of:
    providing a cleaning module comprising a gaseous section containing an ozone gas atmosphere and a solvent section containing a solvent;
    at least partially submerging the substrate within the solvent in the solvent section of the cleaning module;
    rotating the substrate through the solvent whereby a thin layer of the solvent is formed over the organic material on the surface of the substrate and remains disposed over the organic material as the substrate is exposed to the gaseous section; and
    rotating the substrate through the gaseous section of the cleaning module to expose the solvent layer to the ozone gas atmosphere to at least partially remove the organic material from the substrate surface.

12. The method of claim 11, wherein the substrate is rotated through the solvent at a speed of about 1 mm/second to about 10 mm/second.

13. The method of claim 11, further comprising exhausting gaseous by-products from the cleaning module.

14. The method of claim 11, further comprising injecting ozone gas into the gaseous section of the cleaning module from an ozone generator in flow communication with the cleaning module.

15. The method of claim 11, wherein the substrate comprises a semiconductor wafer.

16. The method of claim 11, further comprising, allowing solvent vapors to condense on at least a portion of the organic material, and exposing the condensed solvent vapors to the ozone gas atmosphere in the gaseous section of the cleaning module to at least partially remove the organic material from the substrate surface.

17. The method of claim 11, further comprising mixing ozone gas into the solvent contained within the solvent section.

18. A method for removing organic material from a surface of a substrate, comprising the steps of:
    providing a cleaning module comprising a gaseous section and a solvent section containing a solvent;
    at least partially submerging the substrate within the solvent;
    flowing an ozone gas into the gaseous section of the cleaning module to provide an ozone gas atmosphere; and
    moving the substrate continuously through the solvent and then through the ozone gas atmosphere in the gaseous section of the cleaning module, whereby a meniscus of solvent forms at an interface of the solvent and the substrate, and a thin layer of the solvent remains over the organic material on the surface of the substrate as the substrate is exposed to the ozone gas atmosphere, and the ozone gas reacts with the organic material through the meniscus, the thin layer of the solvent, or both, to remove at least a portion of the organic material from the substrate surface.

19. A method for removing organic material from a surface of a substrate, comprising the steps of:
providing a cleaning module comprising a reaction chamber comprising a gaseous section and a solvent section containing a solvent;
at least partially submerging the substrate within the solvent contained within the solvent section;
rotating the substrate to pass the substrate continuously through the solvent within the solvent section and then through the gaseous section, whereby a thin layer of the solvent remains on the surface of the substrate while passing through the gaseous section of the reaction chamber;
flowing an amount of an ozone gas into the gaseous section of the reaction chamber effective to provide an ozone gas atmosphere and to diffuse through the solvent layer and at least partially remove the organic material from the surface as the substrate passes through the ozone gas atmosphere in the gaseous section of the reaction chamber; and
passing the substrate through the solvent within the solvent section to remove solid reaction by-products from the surface of the substrate.

20. A method for removing organic material from a surface of a substrate, comprising the steps of:
providing a chamber having a gaseous section containing an ozone gas atmosphere and a solvent section containing a solvent;
continuously moving the substrate through the solvent and then into the gaseous section;
whereby a thin layer of the solvent is formed over at least a portion of the: organic material on the surface of the substrate as the substrate moves through the solvent and into the gaseous section; solvent vapors condense as a layer on at least a portion of the organic material while the substrate with the solvent layer disposed from the solvent contained within the solvent section thereon is positioned within the gaseous section; and the solvent layer and the condensed solvent vapor layer are exposed to the ozone gas atmosphere contained within the gaseous section to remove at least a portion of the organic material from the substrate surface.

21. The method of claim 20, whereby the solvent layer, the condensed solvent vapor layer, or both, have a thickness of about 0.001 microns to about 100 microns to allow passage of the ozone therethrough to remove the organic material.

22. The method of claim 20, whereby the solvent layer, the condensed solvent vapor layer, or both, have a thickness of about 0.001 microns to about 50 microns.

23. A method for removing organic material from a surface of a substrate, comprising the steps of:
providing a chamber having a gaseous section containing an ozone gas atmosphere and a solvent section containing a solvent;
mixing ozone gas into the solvent contained in the solvent section;
moving the substrate through the solvent and then into the ozone gas atmosphere in the gaseous section whereby a thin layer of the solvent is formed over at least a portion of the organic material on the surface of the substrate; and
exposing the solvent layer disposed on the substrate to the ozone gas atmosphere within the gaseous section to remove at least a portion of the organic material from the substrate surface.

24. A method for removing organic material from a surface of a substrate, comprising the steps of:
providing a chamber having a gaseous section containing an ozone gas atmosphere and a solvent section containing a solvent;
mixing ozone gas into the solvent;
moving the substrate through the solvent and then into the ozone gas atmosphere in the gaseous section whereby a thin layer of the solvent is formed over at least a portion of the organic material on the surface of the substrate;
allowing solvent vapors to condense as a layer over at least a portion of the organic material while the substrate is moved through the gaseous section; and
exposing the solvent layer and the condensed vapor layer disposed on the substrate to the ozone gas atmosphere within the gaseous section to remove at least a portion of the organic material from the substrate surface.

25. A method for cleaning a surface of a substrate having an organic material disposed thereon, comprising the steps of:
providing a plurality of semiconductor substrates loaded into a carrier;
providing a cleaning module comprising a gaseous section for containing an ozone gas atmosphere, a container for holding a solvent therein and adapted to receive the carrier therein, whereby at least one of the semiconductor substrates is at least partially submerged within the solvent, and a mechanism for contacting the at least one semiconductor substrate and moving a portion of the at least one substrate through the solvent and then through the gaseous section;
loading the carrier into the cleaning module and positioning the carrier in the solvent whereby the at least one semiconductor substrate is placed in contact with the moving mechanism, and the portion of the at least one substrate is at least partially submerged within the solvent;
flowing ozone gas into the gaseous section of the cleaning module to provide an ozone gas atmosphere; and
activating the moving mechanism to move the portion of the at least one substrate through the solvent and then into the ozone gas atmosphere to form a thin layer of solvent over the organic material on the surface of the portion of the at least one substrate and then to expose the solvent layer disposed on the substrate to the ozone gas atmosphere, whereby ozone gas diffuses through the solvent layer to remove at least a portion of the organic material from the surface of the at least one substrate.

26. A method for cleaning a surface of a semiconductor substrate, comprising the steps of:

submerging at least a portion of the substrate in a solvent;

moving the substrate through the solvent to form a thin layer of solvent over the surface of the substrate;

moving the substrate having the layer of solvent disposed thereon into an ozone gas atmosphere overlying the solvent, whereby the ozone gas diffuses through the layer of solvent and at least a portion of organic material disposed on the surface of the substrate is removed; and moving the substrate through the solvent to rinse off solid reaction by-products from the surface of the substrate.

27. A method for cleaning a surface of a semiconductor substrate, comprising the steps of:

continuously moving the semiconductor substrate through a solvent bath and then through an overlying ozone gas atmosphere to form a layer of solvent over the surface of the substrate, to expose the layer of solvent on the surface of the substrate to the ozone gas atmosphere, and to rinse the surface of the substrate to remove organic material from the surface of the substrate.

28. The method of claim 27, wherein the step of continuously moving the substrate comprising rotating the substrate through the solvent bath and then the ozone gas atmosphere.

29. The method of claim 28, wherein the substrate is rotated at a speed of about 1 mm/second to about 10 mm/second.

30. The method of claim 28, whereby the solvent layer has a thickness of about 0.001 microns to about 100 microns.

31. The method of claim 27, wherein the step of continuously moving the substrate comprises vertically moving the substrate into the solvent bath and then into the ozone gas atmosphere.

32. The method of claim 27, further comprising mixing ozone into the solvent within the solvent bath.

33. The method of claim 27, wherein the solvent comprises deionized water.

34. The method of claim 27, whereby the solvent layer has a thickness of about 0.001 microns to about 50 microns.

35. A method for cleaning a surface of a semiconductor substrate, comprising the steps of:

providing a chamber comprising a solvent section containing a solvent and an overlying gaseous section containing an ozone gas atmosphere;

submerging the substrate into the solvent within the solvent section to form a layer of the solvent over at least a portion of the surface of the substrate;

moving the substrate with the layer of solvent disposed thereon into the ozone gas atmosphere within the gaseous section; and moving the substrate through the solvent within the solvent section to remove organic material from the surface of the substrate.

36. The method of claim 35, further comprising mixing ozone into the solvent within the solvent section.

37. The method of claim 35, further comprising exhausting gaseous by-products from the gaseous section of the chamber.

38. A method for cleaning a surface of a semiconductor substrate, comprising the steps of:

providing a chamber comprising a solvent section containing a.solvent and gaseous section overlying the solvent section overlying the solvent section;

maintaining the solvent at a temperature of at about 80° C. to about 95° C., and the gaseous section at about ambient temperature;

positioning the substrate in the gaseous section and allowing solvent vapors formed within the gaseous section from the solvent within the solvent section to condense on the surface of the substrate to form a layer of solvent;

flowing ozone gas into the gaseous section of the chamber to contact the layer of solvent on the substrate; and moving the substrate through the solvent within the solvent section to remove organic material from the surface of the substrate.

39. A method for removing organic material from a surface of a semiconductor substrate, comprising the steps of:

providing a chamber comprising a solvent section containing a solvent and an overlying gaseous section;

maintaining the solvent at a temperature of at about 80° C. to about 95° C., and the gaseous section at about ambient temperature;

moving the substrate through the solvent to form a layer of solvent on at least a portion of the substrate;

moving the substrate from the solvent in the solvent section into the gaseous section and allowing solvent vapors from the solvent formed within the gaseous section to condense on at least a portion of the substrate; and flowing ozone gas into the gaseous section of the chamber to provide an ozone gas atmosphere and to contact the layer of solvent and the condensed solvent on the substrate; and moving the substrate through the solvent within the solvent section to remove organic material from the surface of the substrate.

40. The method of claim 39, wherein the substrate is continuously moved through the solvent contained in the solvent section and then into the ozone gas atmosphere contained in the gaseous section.

41. The method of claim 39, wherein the substrate is rotated through the solvent contained in the solvent section and then through the ozone gas atmosphere contained in the gaseous section.

42. The method of claim 39, wherein the substrate is vertically moved into and out of the solvent and the gaseous layer.

43. A method for removing organic material from a surface of a semiconductor substrate, comprising the steps of:

providing one or more semiconductor substrates loaded into a carrier, providing an apparatus comprising a solvent section containing a solvent, an overlying gaseous section for containing a gas atmosphere, and a mechanism for moving the substrate continuously through to the solvent contained in the solvent section and gas atmosphere contained in the gaseous section;

positioning the carrier in the solvent section to at least partially submerge the one or more semiconductor substrates into the solvent;

flowing ozone gas into the gaseous section to provide an ozone gas, atmosphere; and activating the mechanism of the apparatus to move the one or more substrates through the solvent in the solvent section to form a layer of solvent thereon, and then into the gaseous section to expose the substrate bearing the layer of solvent to the ozone gas atmosphere, and then through the solvent in the solvent section to remove at least a portion of the organic material from the surface of the substrate.

44. The method of claim 43, further comprising exhausting gaseous by-products from the gaseous section.

45. The method of claim 43, further comprising mixing ozone into the solvent in the solvent section.

46. The method of claim 43, further comprising maintaining the temperature of the solvent at about 80° C. to about 95° C., and the gaseous section at about ambient temperature.

47. A method for removing organic material from a surface of a semiconductor substrate, comprising the steps of:

submerging at least a portion of the substrate in a solvent disposed in a container, and continuously moving the portion of the substrate through the solvent, then through an overlying ozone gas atmosphere, and then through the solvent;

wherein moving the substrate through the solvent forms a thin layer of solvent over the surface of the substrate, moving the substrate through the ozone gas atmosphere exposes the layer of solvent to ozone gas such that the ozone gas diffuses through the layer of solvent and at least a portion of organic material disposed on the surface of the substrate is removed, and moving the substrate through the solvent rinses off solid reaction by-products from the surface of the substrate.

* * * * *